United States Patent
Wang (10) Patent No.: US 10,615,438 B2
(45) Date of Patent: Apr. 7, 2020

(54) DEGRADATION DETECTING DEVICE FOR FUEL CELL STACK, FUEL CELL SYSTEM AND MANAGING METHOD THEREOF

(71) Applicant: CUMMINS ENTERPRISE LLC, Indianapolis, IN (US)

(72) Inventor: Honggang Wang, Clifton Park, NY (US)

(73) Assignee: Cummins Enterprise LLC, Indianapolis, IN (US)

( * ) Notice: Subject to any disclaimer, the term of this patent is extended or adjusted under 35 U.S.C. 154(b) by 244 days.

(21) Appl. No.: 15/903,137

(22) Filed: Feb. 23, 2018

(65) Prior Publication Data

US 2019/0267643 A1 Aug. 29, 2019

(51) Int. Cl.
| | |
|---|---|
| H01M 8/04 | (2016.01) |
| H01M 8/04858 | (2016.01) |
| H01M 8/0432 | (2016.01) |
| H01M 8/04701 | (2016.01) |
| G01R 31/382 | (2019.01) |

(52) U.S. Cl.
CPC ........ *H01M 8/0488* (2013.01); *G01R 31/382* (2019.01); *H01M 8/0491* (2013.01); *H01M 8/04365* (2013.01); *H01M 8/04701* (2013.01)

(58) Field of Classification Search
CPC ........... H01M 8/0488; H01M 8/04365; H01M 8/04701; H01M 8/0491
See application file for complete search history.

(56) References Cited

U.S. PATENT DOCUMENTS

| | | |
|---|---|---|
| 6,815,107 B2 | 11/2004 | Inai et al. |
| 6,851,298 B2 | 2/2005 | Miura et al. |
| 6,872,480 B2 | 3/2005 | Keller et al. |
| 7,425,380 B2 | 9/2008 | Matoba et al. |
| 7,442,452 B2 | 10/2008 | Miura |
| 7,581,431 B2 | 9/2009 | Yoshida |

(Continued)

FOREIGN PATENT DOCUMENTS

| | | |
|---|---|---|
| JP | 2015128001 A | 7/2015 |
| WO | 2009041370 A1 | 4/2009 |

OTHER PUBLICATIONS

Mao et al., "Investigation of polymer electrolyte membrane fuel cell internal behaviour during long term operation and its use in prognostics", Journal of Power Sources, vol. 362, pp. 39-49, Sep. 15, 2017.

*Primary Examiner* — Jane J Rhee
(74) *Attorney, Agent, or Firm* — Barnes & Thornburg LLP (57) ABSTRACT

A degradation detecting device for a fuel cell stack includes one or more sensors, a first detection module, a second detection module and a detection fusion module. The one or more sensors measure signals of two adjacent fuel cell groups to obtain a measurement of each of the two adjacent fuel cell groups. The first detection module detects a rate of change of deviation between the two measurements and generates a first detection result based on the detected rate of change of deviation. The second detection module detects a trending divergence between the two measurements and generates a second detection result based on the detected trending divergence. The detection fusion module fuses the first detection result and the second detection result to generate a final detection result of the fuel cell stack. A fuel cell system having the degradation detecting device and a managing method thereof are also disclosed.

20 Claims, 7 Drawing Sheets

(56) References Cited

U.S. PATENT DOCUMENTS

| | | |
|---|---|---|
| 7,695,838 B2 | 4/2010 | Komachiya et al. |
| 7,841,228 B2 | 11/2010 | Farnsworth |
| 8,216,729 B2 | 7/2012 | Yoshida |
| 8,676,416 B2 | 3/2014 | Ham et al. |
| 8,843,355 B2 | 9/2014 | Kimura et al. |
| 9,190,683 B2 | 11/2015 | Takaichi et al. |
| 9,425,472 B2 | 8/2016 | Jeong et al. |
| 9,496,571 B2 | 11/2016 | Foster et al. |
| 9,548,611 B2 | 1/2017 | Park et al. |
| 2012/0251900 A1 | 10/2012 | Sugawara et al. |
| 2013/0084510 A1 | 4/2013 | Masui et al. |

DEGRADATION DETECTING DEVICE FOR FUEL CELL STACK, FUEL CELL SYSTEM AND MANAGING METHOD THEREOF

BACKGROUND

This disclosure relates generally to the field of fuel cells, and more particularly to a degradation detecting device for a fuel cell stack, a fuel cell system having the degradation detecting device and a managing method thereof.

Fuel cells are electro-chemical devices which can convert chemical energy from a fuel into electrical energy through an electro-chemical reaction of the fuel, such as hydrogen, with an oxidizer, such as oxygen contained in the atmospheric air. Fuel cell systems are being widely developed as an energy supply system because fuel cells are environmentally superior and highly efficient. As single fuel cell can only generate voltages of about 1V, therefore, a plurality of fuel cells are usually stacked together (usually referred to as a fuel cell stack) to get a desired voltage.

A taller or larger fuel cell stack is favorable due to its compact integration and ease of installation. Multiple fuel cell stacks are usually located in a shared hotbox for higher thermal efficiency. Due to thermal/mechanical stress, thermal fatigue, Ni/NiO reaction, catalyst poisoning, crossover/ overboard leakage and/or cell/stack defect, the fuel cell stack will inevitably degrade. If the degradation cannot be detected in time, the fuel cell stack may quickly lead to an irreversible failure result, such as thermal runaway, or even explosion.

Therefore, how to detect degradation of the fuel cell stack as early as possible would become increasingly urgent.

BRIEF DESCRIPTION

In one aspect of embodiments of the present disclosure, a degradation detecting device for a fuel cell stack is provided, wherein the fuel cell stack comprises fuel cell groups which are connected in series. The degradation detecting device comprises one or more sensors, a first detection module, a second detection module and a detection fusion module. The one or more sensors are configured for measuring signals of two adjacent fuel cell groups to obtain a measurement of each of the two adjacent fuel cell groups. The first detection module is configured for detecting a rate of change of deviation between the measurements of the two adjacent fuel cell groups and generating a first detection result of the fuel cell stack based on the detected rate of change of deviation. The second detection module is configured for detecting a trending divergence between the measurements of the two adjacent fuel cell groups and generating a second detection result of the fuel cell stack based on the detected trending divergence. The detection fusion module is configured for fusing the first detection result and the second detection result to generate a final detection result of the fuel cell stack. The final detection result of the fuel cell stack indicates whether the fuel cell stack has degraded.

In another aspect of embodiments of the present disclosure, a fuel cell system is provided. The fuel cell system comprises one or more fuel cell stacks which are connected in parallel, a degradation detection device for detecting degradation of the one or more fuel cell stacks, and a controller. Each fuel cell stack comprises serially connected fuel cell groups. The degradation detecting device comprises one or more sensors, a first detection module, a second detection module and a detection fusion module. The one or more sensors are configured for measuring signals of two adjacent fuel cell groups in one fuel cell stack to obtain a measurement of each of the two adjacent fuel cell groups. The first detection module is configured for detecting a rate of change of deviation between the measurements of the two adjacent fuel cell groups and generating a first detection result of the one fuel cell stack based on the detected rate of change of deviation. The second detection module is configured for detecting a trending divergence between the measurements of the two adjacent fuel cell groups and generating a second detection result of the one fuel cell stack based on the detected trending divergence. The detection fusion module is configured for fusing the first detection result and the second detection result to generate a final detection result of the one fuel cell stack. The controller is configured for controlling the one degraded fuel cell stack when the one fuel cell stack is detected to degradation.

In still another aspect of embodiments of the present disclosure, a method for managing a fuel cell system is provided. The method comprises: detecting degradation of parallelly connected fuel cell stacks in the fuel cell system which comprises measuring signals of two adjacent of serially connected fuel cell groups in one fuel cell stack to obtain a measurement of each of the two adjacent fuel cell groups; detecting a rate of change of deviation between the measurements of the two adjacent fuel cell groups and generating a first detection result of the one fuel cell stack based on the detected rate of change of deviation; detecting a trending divergence between the measurements of the two adjacent fuel cell groups and generating a second detection result of the one fuel cell stack based on the detected trending divergence; and fusing the first detection result and the second detection result to generate a final detection result of the one fuel cell stack, and controlling the one degraded fuel cell stack when the one fuel cell stack is detected to degradation.

DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

Embodiments of the present disclosure will be described hereinbelow with reference to the accompanying drawings. In the following description, well-known functions or constructions are not described in detail to avoid obscuring the disclosure in unnecessary detail.

Unless defined otherwise, technical and scientific terms used herein have the same meaning as is commonly understood by one of ordinary skill in the art to which this disclosure belongs. The terms "first", "second", and the like, as used herein do not denote any order, quantity, or importance, but rather are used to distinguish one element from another. Also, the terms "a" and "an" do not denote a limitation of quantity, but rather denote the presence of at least one of the referenced items. The term "or" is meant to be inclusive and mean either or all of the listed items. The use of "including", "comprising" or "having" and variations thereof herein are meant to encompass the items listed thereafter and equivalents thereof as well as additional items. The terms "connected" and "coupled" are not restricted to physical or mechanical connections or couplings, and can include electrical connections or couplings, whether direct or indirect. In addition, Terms indicating specific locations, such as "top", "bottom", "left", and "right", are descriptions with reference to specific accompanying drawings. Embodiments disclosed in the present disclosure may be placed in a manner different from that shown in the figures. Therefore, the location terms used herein should not be limited to locations described in specific embodiments.

Degradation Detecting Device for Fuel Cell Stack

Figure 1:
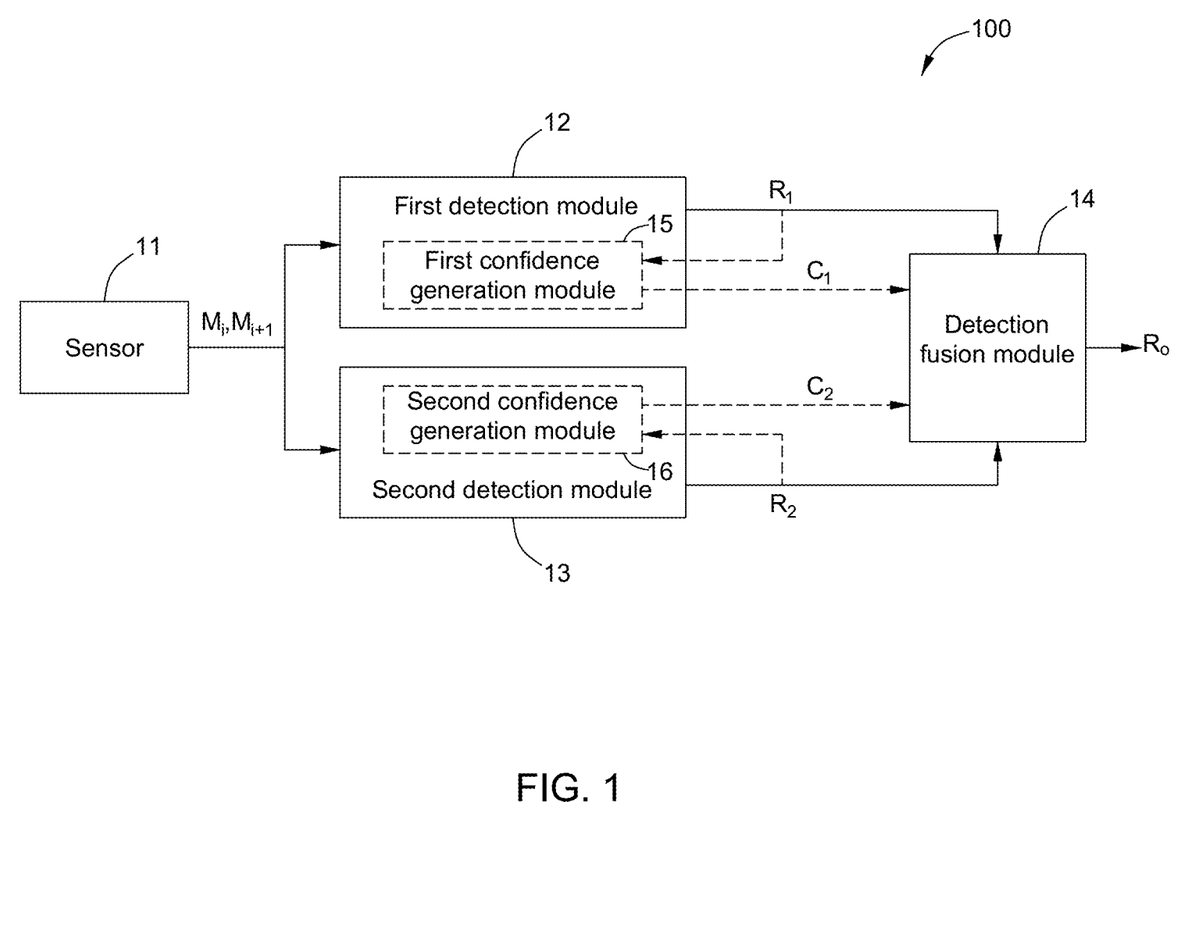
FIG. 1 is a schematic diagram of an exemplary degradation detecting device for a fuel cell stack in accordance with one embodiment of the present disclosure.
Figure 2:
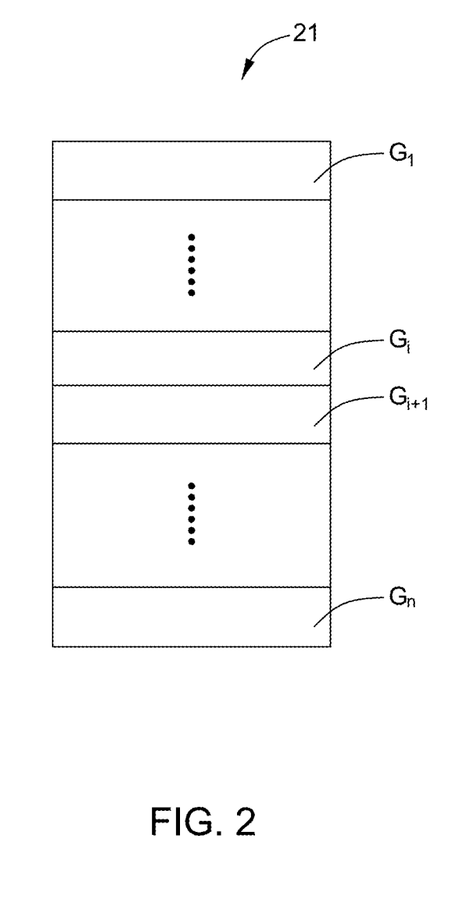
FIG. 2 is a schematic diagram of a fuel cell stack.

FIG. 1 illustrates a schematic block diagram of an exemplary degradation detecting device 100 for a fuel cell stack 21 in accordance with one embodiment of the present disclosure. As shown in FIG. 2, the fuel cell stack 21 may generate electric power by an electro-chemical reaction of a fuel with oxygen in the air, and may include a plurality of fuel cell groups $G_1$-$G_n$ which are connected in series. Each fuel cell group may include a plurality of fuel cells. As shown in FIG. 1, the degradation detecting device 100 includes one or more sensors 11, a first detection module 12 and a second detection module 13 which may be communicated with the one or more sensors 11, and a detection fusion module 14.

The one or more sensors 11 may measure signals of two adjacent fuel cell groups, for example the fuel cell groups $G_i$ and $G_{i+1}$ (i=1 to n-1), in the fuel cell stack 21 and a measurement of each of the two adjacent fuel cell groups $G_i$ and $G_{i+1}$ may be thus obtained, i.e. the measurement $M_i$ of the fuel cell group $G_i$ and the measurement $M_{i+1}$ of the fuel cell group $G_{i+1}$. In one embodiment, the one or more sensors 11 may include one or more voltage sensors for measuring voltages of the two adjacent fuel cell groups $G_i$ and $G_{i+1}$, and thus the two measurements $M_i$ and $M_{i+1}$ obtained are voltage measurements of the two adjacent fuel cell groups $G_i$ and $G_{i+1}$. In another embodiment, the one or more sensors 11 may include one or more temperature sensors for measuring temperatures of the two adjacent fuel cell groups $G_i$ and $G_{i+1}$, and thus the two measurements $M_i$ and $M_{i+1}$ obtained are temperature measurements of the two adjacent fuel cell groups $G_i$ and $G_{i+1}$.

It should be understood that each fuel cell group in the present disclosure is measured as a whole, one sensor 11 may measure a signal of one and only one fuel cell group, or one sensor 11 may also measure signals of more fuel cell groups. For example, in one embodiment, the degradation detecting device 100 may include plural sensors. The number of sensors is the same as that of the fuel cell groups. Each sensor measures a signal of one fuel cell group. In another embodiment, the degradation detection device 100 may include one sensor. The sensor may measure signals of plural fuel cell groups.

The first detection module 12 may receive the measurements $M_i$ and $M_{i+1}$ of the two adjacent fuel cell groups $G_i$ and $G_{i+1}$ from the one or more sensors 11, and may detect a rate of change of deviation between the two measurements $M_i$ and $M_{i+1}$ and generate a first detection result $R_1$ of the fuel cell stack 21 based on the detected rate of change of deviation. As shown in the following equation (1), when the rate of change of deviation between the two measurements is above a predetermined threshold, the first detection result $R_1$ generated by the first detection module 12 indicates a degradation sign of the fuel cell stack 21.

$$R_1 = \begin{cases} 1, & \left|\frac{d(V_2 - V_1)}{dt}\right| \geq \delta \\ 0, & \left|\frac{d(V_2 - V_1)}{dt}\right| < \delta \end{cases} \quad (1)$$

In equation (1), $V_2$ and $V_1$ represents voltage measurements of the two adjacent fuel cell groups $G_{i+1}$ and $G_i$, and $\delta$ represents the predetermined threshold. The predetermined threshold $\delta$ may be adjusted according to actual detection requirements.

The second detection module 13 may receive the measurements $M_i$ and $M_{i+1}$ of the two adjacent fuel cell groups $G_i$ and $G_{i+1}$ from the one or more sensors 11, and may detect a trending divergence between the two measurements $M_i$ and $M_{i+1}$ and generate a second detection result $R_2$ of the fuel cell stack 21 based on the detected trending divergence. As shown in the following equation (2), when the rates of change of the two measurements have different sign, the second detection result $R_2$ generated by the second detection module 13 indicates a degradation sign of the fuel cell stack 21.

$$R_2 = \begin{cases} 1, & -\text{sign}(roc_{V_2} \times roc_{V_1}) = 1 \\ 0, & -\text{sign}(roc_{V_2} \times roc_{V_1}) \neq 1 \end{cases} \quad (2)$$

In equation (2), $roc_{V_2}$ and $roc_{V_1}$ represents the rates of change of the voltage measurements of the two adjacent fuel cell groups $G_{i+1}$ and $G_i$ respectively.

In the degradation detecting device 100 of the present disclosure, the first detection module 12 and the second detection module 13 may detect in parallel, and a redundant detection method may be thus provided for the fuel cell stack 21.

The first detection result $R_1$ from the first detection module 12 and the second detection result $R_2$ from the second detection module 13 may be fed into the detection fusion module 14. The detection fusion module 14 may fuse the first detection result $R_1$ and the second detection result $R_2$ to generate a final detection result $R_o$ of the fuel cell stack 21. The final detection result $R_o$ of the fuel cell stack 21 may indicate whether the fuel cell stack 21 has degraded. The detection fusion module 14 may provide flexibility on tradeoff of speed and reliability of degradation detection.

In one embodiment, the detection fusion module 14 may fuse the first detection result $R_1$ and the second detection result $R_2$ by weighting the first detection result $R_1$ and the second detection result $R_2$. As an example, the detection fusion module 14 weights the first detection result $R_1$ and the second detection result $R_2$ based on respective confidences $C_1$ and $C_2$ of the first detection module 12 and the second detection module 13. The respective confidences $C_1$ and $C_2$ of the first detection module 12 and the second detection module 13 are indicative of respective detection reliability of the first detection module 12 and the second detection module 13.

With continued reference to FIG. 1, the degradation detecting device 100 may further include a first confidence generation module 15 and a second confidence generation module 16. The first confidence generation module 15 may generate a confidence $C_1$ of the first detection module 12 based on historical performance of the first detection result $R_1$. The second confidence generation module 16 may generate a confidence $C_2$ of the second detection module 13 based on historical performance of the second detection result $R_2$. The historical performance of the first detection result $R_1$ and the second detection result $R_2$ can be false alarm rate, alarm missing rate, or a coefficient determined by the user.

Optionally, the first confidence generation module 15 and the second confidence generation module 16 may be respectively integrated in the first detection module 12 and the second detection module 13. Certainly, the first confidence generation module 15 and the second confidence generation module 16 may be also independent from the first detection module 12 and the second detection module 13, and are as one or two separate modules.

In another embodiment, the detection fusion module 14 may fuse the first detection result $R_1$ and the second detection result $R_2$ by performing a logic AND. This means the detection fusion module 14 will give a true degradation signal if and only if the first detection result $R_1$ and the second detection result $R_2$ are both true. In still another embodiment, the detection fusion module 14 may fuse the first detection result $R_1$ and the second detection result $R_2$ by performing a logic OR. This means the detection fusion module 14 will give a true degradation signal if any of the first detection result $R_1$ and the second detection result $R_2$ is true. The fusion of the first detection result $R_1$ and the second detection result $R_2$ mentioned in the present disclosure should not be limited to the above-identified fusing method.

The degradation detecting device 100 of the present disclosure may detect the degradation or failure sign of the fuel cell stack 21 as early as possible, and early detection on degradation can prevent further loss of the fuel cell stack 21 and/or a fuel cell system 200 due to thermal runaway or fire explosion.

Furthermore, the degradation detecting device 100 of the present disclosure may use in parallel the first detection module 12 and the second detection module 13 to detect degradation of the fuel cell stack 21, and such a redundant detection method may provide enhanced reliability and reduce chance on false alarm.

Fuel Cell System with Degradation Detection Device

Figure 3:
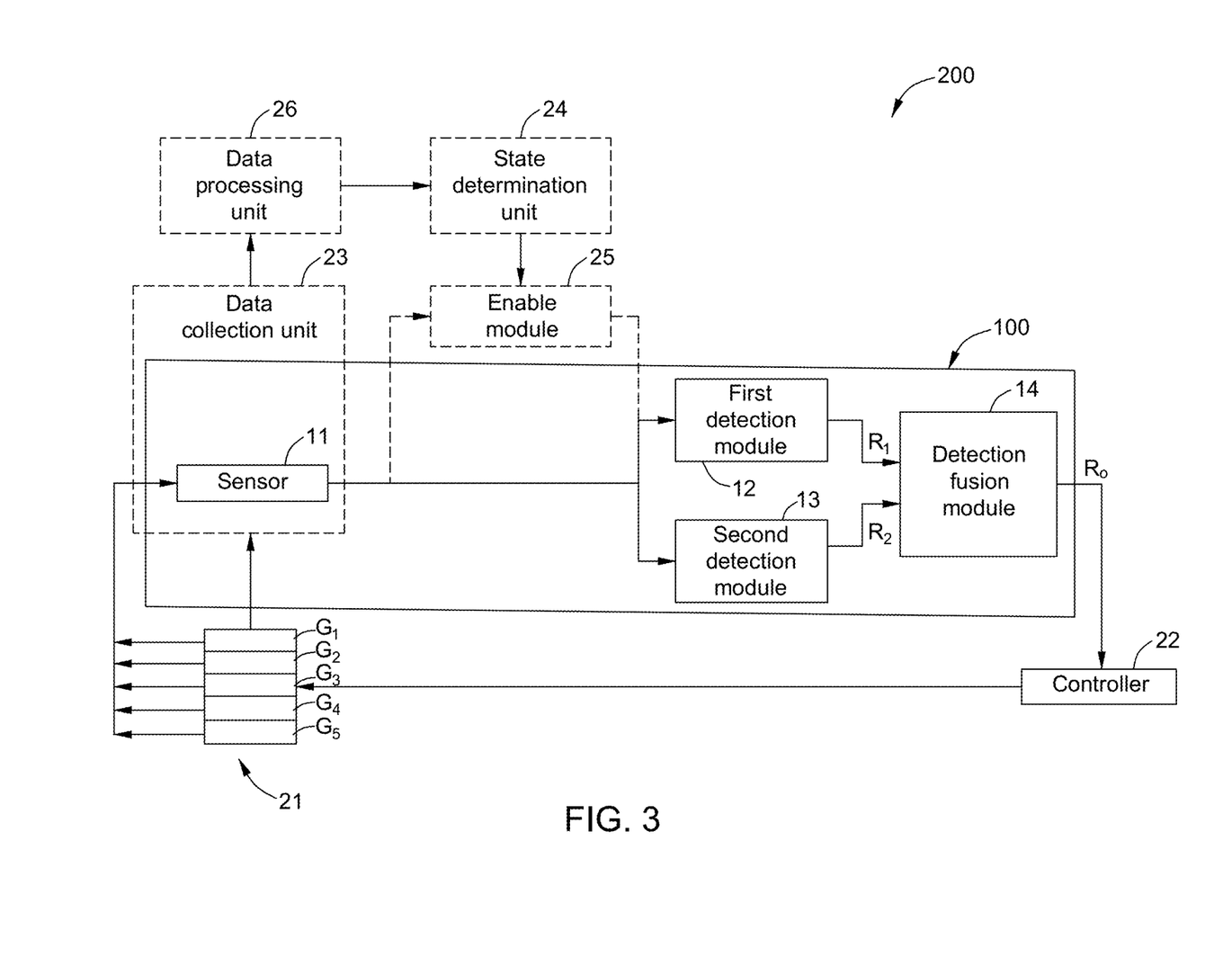
FIG. 3 is a schematic diagram of a portion of a fuel cell system having the degradation detecting device of FIG. 1 in accordance with one embodiment of the present disclosure.

FIG. 3 illustrates a schematic diagram of a fuel cell system 200 in accordance with one embodiment of the present disclosure. As shown in FIG. 3, the fuel cell system 200 may include the degradation detecting device 100 above-mentioned, and one or more fuel cell stacks 21 which are connected in parallel. Each fuel cell stack 21 may include serially connected fuel cell groups. In the fuel cell system 200 of the present disclosure, the number of fuel cell groups included in the fuel cell stack 21 is shown to be five as an example, fuel cell groups $G_1$, $G_2$, $G_3$, $G_4$ and $G_5$. The degradation detection device 100 may detect degradation of the one or more fuel cell stacks 21 in the fuel cell system 200.

The fuel cell system 200 may include a data collection unit 23, a state determination unit 24 and an enable module 25. The data collection unit 23 includes the one or more sensors 11 in the degradation detecting device 100 and may collect fuel cell data in the fuel cell system 200. The fuel cell data may include at least one of temperature, power, voltage, current, flowrates, gas composition and pressures. The state determination unit 24 may receive the collected fuel cell data and may determine whether the fuel cell system 200 is in an operating state based on the collected fuel cell data. When the state determination unit 24 determines that the fuel cell system 200 is in the operating state, an output of the enable module 25 may become true, and the degradation detecting device 100 is enabled and may be used for degradation detection. When the state determination unit 24 determines that the fuel cell system 200 is in the non-operation state such as a repairing state, a maintenance state, a start-up state, an offline state, a shutdown state, etc., the output of the enable module 25 may come false and the degradation detecting device 100 is disabled.

In order to remove spikes in the collected fuel cell data from the data collection unit 23 (including the measurements $M_i$ and $M_{i+1}$ of the two adjacent fuel cell groups $G_i$ and $G_{i+1}$ from the one or more sensors 11), the fuel cell system 200 may further include a data processing unit 26. The collected fuel cell data may be first fed into the data processing unit 26. The data processing unit 26 may process the collected fuel cell data, for example by moving average or low pass filtering algorithm to remove the spikes. Then, the processed fuel cell data by the data processing unit 26 may be fed into the state determination unit 24. Under this circumstance, the state determination unit 24 may determine whether the fuel cell system 200 is in the operating state based on the processed fuel cell data.

The fuel cell system 200 of the present disclosure uses the degradation detecting device 100 having the double detecting modules to detect degradation or failure of each fuel cell stack 21, thus degradation of the fuel cell stack 21 or failure of the whole fuel cell system 200 may be detected with low false alarm as early as possible, and further loss of the fuel cell stack 21 and/or the whole fuel cell system 200 can be prevented due to thermal runaway or fire explosion.

In addition, in the fuel cell system 200 of the present disclosure, there is no hardware or intrusion on system operation which may reduce installation and operating costs.

With continued reference to FIG. 3, the fuel cell system 200 of the present disclosure may further include a controller 22. The controller 22 may be communicated with the degradation detecting device 100, and may control the degraded fuel cell stack 21 when any one fuel cell stack 21 is detected to degradation, i.e. when the final detection result of any one fuel cell stack 21 detected by the degradation detecting device 100 indicates that the fuel cell stack 21 has degraded.

Figure 4:
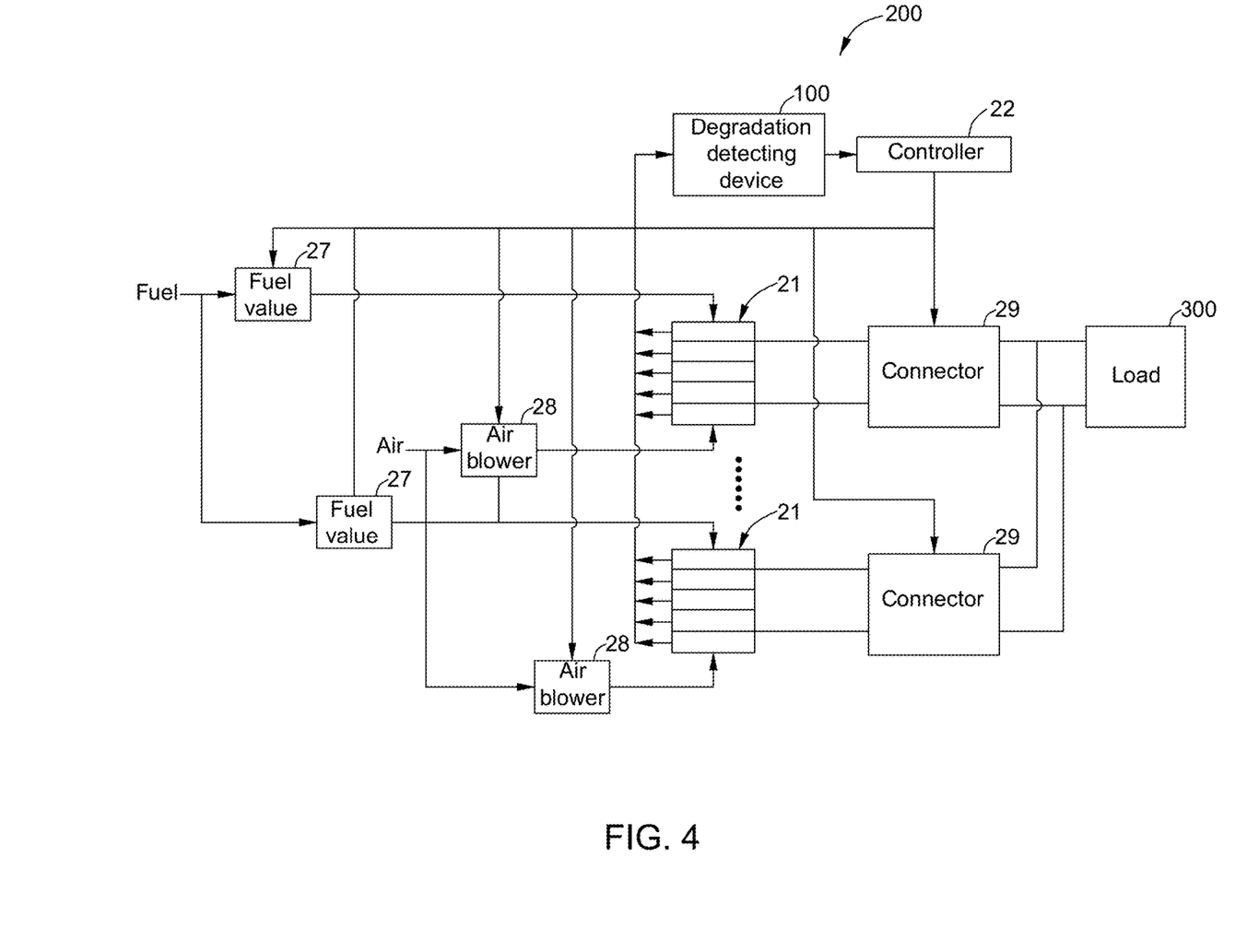
FIG. 4 is a schematic diagram of another portion of the fuel cell system of FIG. 3.

Referring to FIG. 4, the fuel cell system 200 may further include fuel valves 27, air blowers 28 and connectors 29. The fuel valves 27, air blowers 28 and connectors 29 each have the number corresponding to the number of the fuel cell stacks 21. A fuel may be supplied to one fuel cell stack 21 via one fuel valve 27 and the air may be supplied to the fuel cell stack 21 via one air blower 28. Each fuel cell stack 21 is coupled to a load 300 via a connector 29, and thus an electrical current drawn from each fuel cell stack 21 may be selectively provided to the load 300. Each fuel valve 27, each air blower 28 and each connector 29 may be controlled by the controller 22.

During the fuel cell system 200 is in operation, when one or more fuel cell stacks 21 occur to degradation and it is required to isolate the one or more fuel cell stacks 21, the controller 22 may switch off one or more respective fuel valves 27, one or more respective air blowers 28 and one or more respective connector 29, and thus one or more respective fuel flow channels, one or more respective air flow channels, and one or more respective current output channels may be cut off.

The fuel cell system 200 of the present disclosure can not only detect degradation of the fuel cell stack 21 in time, but also take effective action to the degraded fuel cell stack 21 after the fuel cell stack 21 is detected to degradation.

Method for Managing Fuel Cell System

Figure 5:
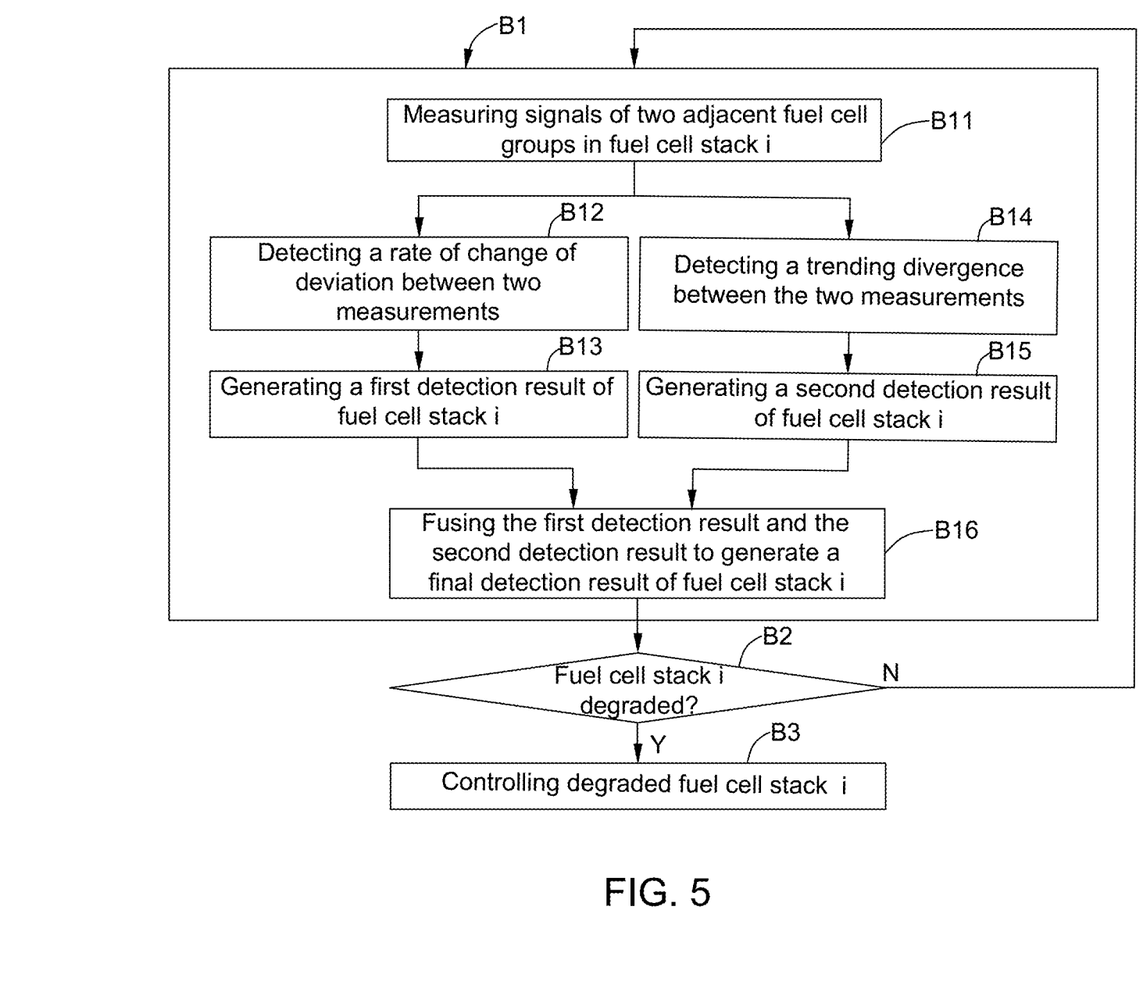
FIG. 5 is a flow chart of a method for managing a fuel cell system in accordance with one embodiment of the present disclosure.

FIG. 5 illustrates a flow chart of a method for managing a fuel cell system in accordance with one embodiment of the present disclosure. The managing method may include the steps as follows.

As shown in block B1 of FIG. 5, degradation of parallelly connected fuel cell stacks in the fuel cell system is detected. For any one fuel cell stack i, its degradation detecting may include the following steps B11-B16.

In block B11, signals of two adjacent of serially connected fuel cell groups in the fuel cell stack i are measured to obtain a measurement of each of the two adjacent fuel cell groups, and then the process goes to block B12 and block B14 respectively.

In block B12, a rate of change of deviation between the measurements of the two adjacent fuel cell groups is detected, and next the process continues to block B13. In block B13, a first detection result of the fuel cell stack i is generated based on the detected rate of change of deviation between the measurements of the two adjacent fuel cell groups. Then, the process goes to block B16.

In block B14, a trending divergence between the measurements of the two adjacent fuel cell groups is detected, and next the process continues to block B15. In block B15, a second detection result of the fuel cell stack i is generated based on the detected trending divergence. Then, the process goes to block B16.

In block B16, the first detection result generated in block B13 and the second detection result generated in block B15 are fused to generate a final detection result of the fuel cell stack i. Then, the process goes to block B2.

In block B2, the final detection result of the fuel cell stack i indicates whether the fuel cell stack i has degraded. When the fuel cell stack i is indicated to degradation, the process goes to block B3. Otherwise, the process returns to block B1 for continuing to detect degradation of the fuel cell stack.

In block B3, the degraded fuel cell stack i is controlled when the fuel cell stack i is detected to degradation.

Hereinafter, how to control the degraded fuel cell stack i after the fuel cell stack i is detected to degradation in block B3 of FIG. 6 will be explained in detail with reference to FIG. 6.

Figure 6:
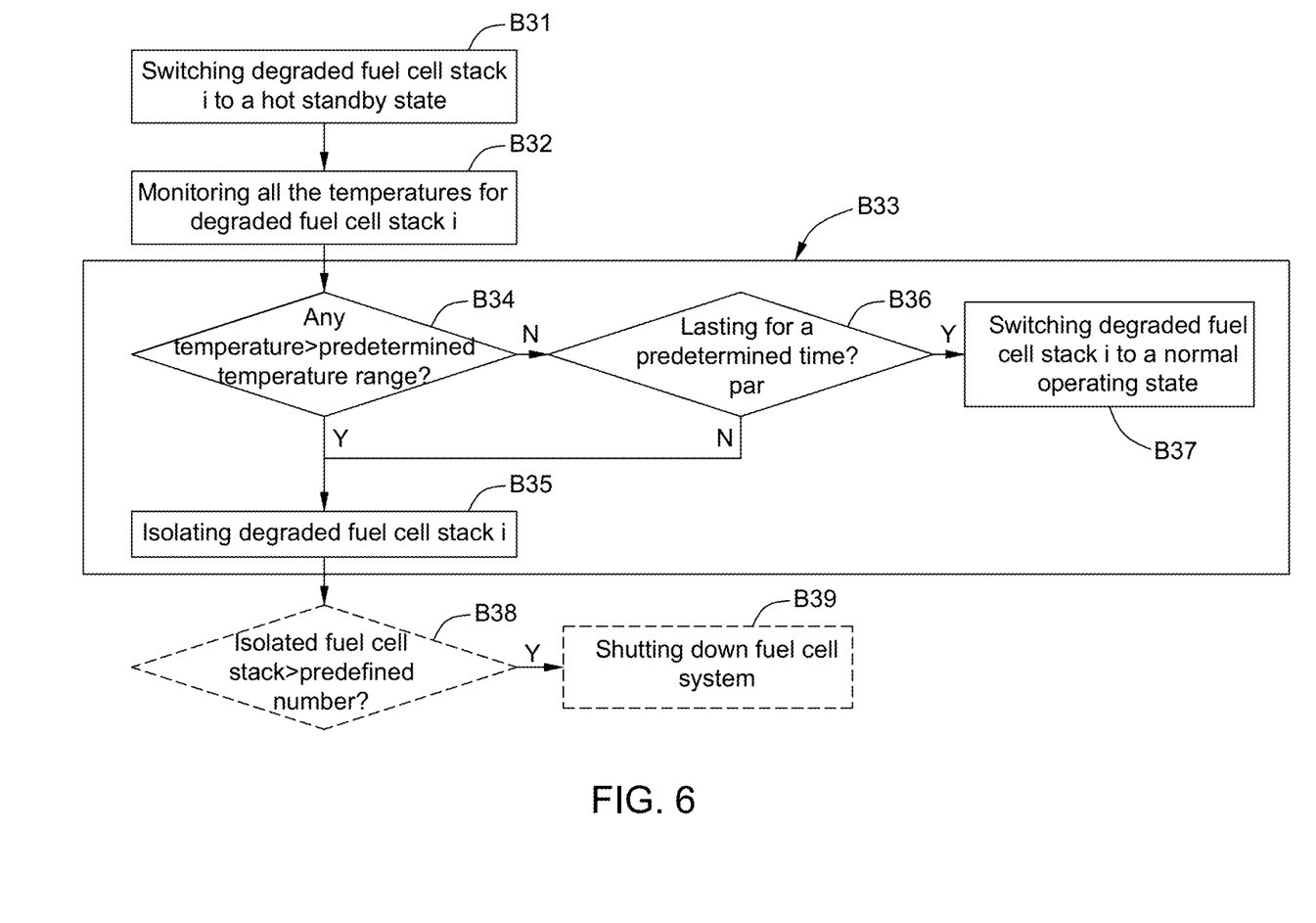
FIG. 6 is a flow chart of how to control a degraded fuel cell stack in FIG. 5.

As shown in FIG. 6, in block B31, the degraded fuel cell stack i is switched to a hot standby state. The hot standby is a state with no power output and high temperature which could switch to a power generation state in about 1 hour.

In block B32, all the temperatures for the degraded fuel cell stack i is monitored. The monitored temperatures for the degraded fuel cell stack i may include the temperatures of the fuel cell groups, a temperature of a top plate, and one or more temperatures of a bottom plate of the degraded fuel cell stack.

In block B33, the degraded fuel cell stack i is processed based on all the monitored temperatures for the degraded fuel cell stack i. Processing the degraded fuel cell stack i may include the following steps B34-B37.

In block B34, it is determined whether any temperature for the degraded fuel cell stack i exceeds a predetermined temperature range. When there is any temperature exceeding the predetermined temperature range, the process goes to block B35. Otherwise, the process goes to block B36. An embodiment of the predetermined temperature range in block B34 can be from 800° C. to 900° C. A preferred embodiment of the predetermined temperature range in block B34 can be from 820° C. to 880° C. A further preferred embodiment of the predetermined temperature range in block B34 can be from 840° C. to 860° C.

In block B35, the degraded fuel cell stack i is isolated, and then the process continues to block B38.

In block B36, the accumulating time when all the temperature value stays below the predetermined temperature range is calculated. If the accumulating time is greater than a predetermined time, the process goes to block B37 and in block B37, the degraded fuel cell stack i is switched to a normal operating state. Otherwise, the process goes to block B35 to isolate the degraded fuel cell stack i. An embodiment of the predetermined time in block B36 can be from 10 minutes to 2 hours. A preferred embodiment of the predetermined time in block B36 can be from 30 minutes to 1.5 hours. A further preferred embodiment of the predetermined time in block B36 can be from 1 hour to 1.5 hours.

In block B38, it is determined whether the number of isolated fuel cell stacks in the fuel cell system exceeds a predefined number? When the number of isolated fuel cell stacks exceeds the predefined number, the process goes to block B39 and in block B39, the fuel cell system is shut down. The predefined number of isolated fuel cell stacks in block B38 depends on the total number of fuel cell stacks in the fuel cell system. An example for the predefined number of isolated fuel cell stack in block B38 is 50% of the total number of fuel cell stacks in the fuel cell system.

The degradation detecting method of the present disclosure may detect the degradation or failure of the fuel cell stack as early as possible and have low false alarm. Furthermore, the managing method of the present disclosure may better manage and control the degraded fuel cell stack and even the whole fuel cell system after the fuel cell stack is detected to degradation, and may improve reliability and stability of the fuel cell system operation.

Figure 7:
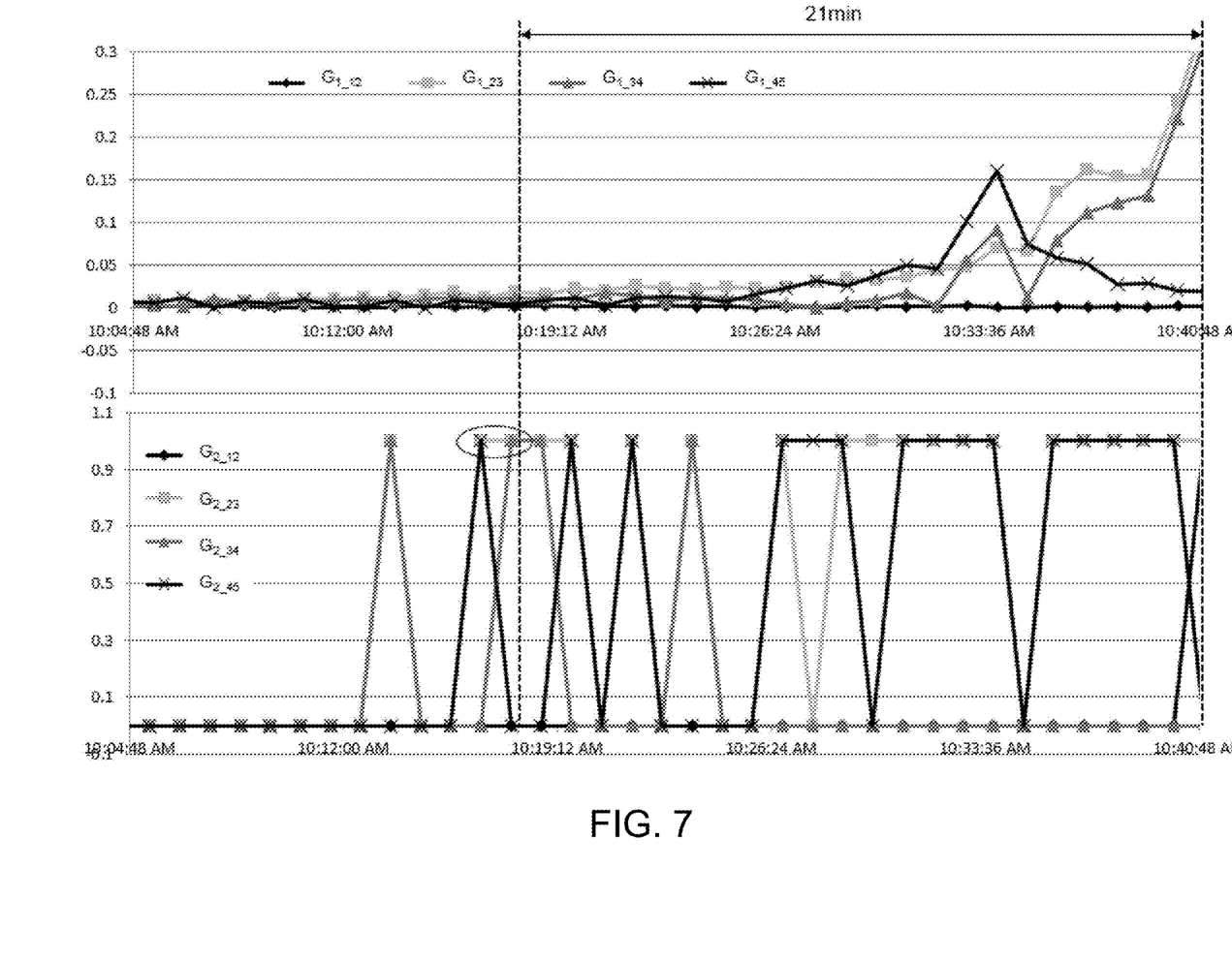
FIG. 7 is an effect view of detection of using a degradation detecting method of the present disclosure in comparison with a conventional operator inspection.

FIG. 7 illustrates an effect view of detection of using the degradation detecting method of the present disclosure in comparison with a conventional operator inspection. In this test, a fuel cell stack used was divided into five fuel cell groups. In FIG. 7, the X axis represents the time.

The upper figure in FIG. 7 shows an example method used in the first detection module 12 of the degradation detecting device 100. The lines $G_{1\_12}$, $G_{1\_23}$, $G_{1\_34}$ and $G_{1\_45}$ in the upper figure represent respectively the rates of change of deviations between the two adjacent fuel cell groups $G_1$ and $G_2$, between the two adjacent fuel cell groups $G_2$ and $G_3$, between the two adjacent fuel cell groups $G_3$ and $G_4$, and between the two adjacent fuel cell groups $G_4$ and $G_5$. In the upper figure, "0.02" was selected as the predetermined threshold δ in the equation (1) for detecting degradation. If any one line in the upper figure is above 0.02, the first detection module 12 will generate the first detection result $R_1$ indicating a degradation sign in the two adjacent fuel cell groups represented by the line.

The lower figure in FIG. 7 shows an example method used in the second detection module 13 of the degradation detecting device 100. The lines $G_{2\_12}$, $G_{2\_23}$, $G_{2\_34}$ and $G_{2\_45}$ in the lower figure represent respectively the trending divergences between the two adjacent fuel cell groups $G_1$ and $G_2$, between the two adjacent fuel cell groups $G_2$ and $G_3$, between the two adjacent fuel cell groups $G_3$ and $G_4$, and between the two adjacent fuel cell groups $G_4$ and $G_5$. In the lower figure, "two consecutive trending divergences equal to 1" was selected as a threshold in the equation (2) for detecting degradation. If two consecutive trending divergences are equal to 1, the second detection module 13 will generate the second detection result $R_2$ indicating a degradation sign in the two adjacent fuel cell groups represented by the line.

Different rules or decision-making methods can be used in detection fusion module 14 of the degradation detecting device 100 based on the first detection result $R_1$ from the first detection module 12 and/or the second detection result $R_2$ from the second detection module 13.

One specific embodiment for decision making in the detection fusion module 14 is shown in the following equation (3). The first detection result $R_1$ generated by the first detection module 12 at time k is denoted as $R_1(k)$, and the second detection result $R_2$ generated by the second detection module 13 at time k is denoted as $R_2(k)$. The detection fusion module 14 at time k will report a degradation, or $R_o(k)=1$, if the first detection results $R_1$ generated by the first detection module 12 during the last n consecutive time steps indicate degradation sign. The number of consecutive time steps n is a positive integer. A larger value of n will lead to longer time for anomaly detection, while a smaller value of n will lead to higher risk of false alarm. An example for the consecutive time steps n is 3.

$$R_o(k) = \begin{cases} 1, R_1(l) = R_1(k-1) = \ldots = R_1(k-n) = 1 \\ 0, \text{otherwise} \end{cases} \quad (3)$$

It can be understood that using the equation (3) in the detection fusion module 14 may be based on the confidence $C_1$ of the first detection module 12 larger than a first threshold.

Another embodiment for decision making in the detection fusion module 14 is shown in the following equation (4). The detection fusion module 14 at time k will report a degradation, or $R_o(k)=1$, if the second detection results $R_2$ generated by the second detection module 13 during the last m consecutive time steps indicate degradation sign. The number of consecutive time steps m is a positive integer. A larger value of m will lead to longer time for anomaly detection, while a smaller value of m will lead to higher risk of false alarm. An example form is 3.

$$R_o(k) = \begin{cases} 1, R_2(l) = R_2(k-1) = \ldots = R_2(k-n) = 1 \\ 0, \text{otherwise} \end{cases} \quad (4)$$

It can be understood that using the equation (4) in the detection fusion module 14 may be based on the confidence $C_2$ of the second detection module 13 larger than a second threshold.

Still another embodiment for decision making in the detection fusion module 14 is shown in the following equation (5). The detection fusion module 14 at time k will report a degradation, or $R_o(k)=1$, if both the first detection result $R_1$ generated by the first detection module 12 at time k and the second detection result $R_2$ generated by the second detection module 13 at time k indicate degradation sign.

$$R_o(k) = \begin{cases} 1, R_1(k) = R_2(k) = 1 \\ 0, \text{otherwise} \end{cases} \quad (5)$$

It can be understood that when the detection fusion module 14 adopt the equation (5) to make decision, the confidences $C_1$ and $C_2$ of the first detection module 12 and the second detection module 13 may be neglected.

In this test, the detection fusion module 14 will adopt the decision making rule shown in equation (5). In the upper figure that at 10:19 AM, $G_{1\_23}$ first reached the threshold of 0.02 and thus the degradation sign in the two adjacent fuel cell groups $G_2$ and $G_3$ was detected from the first detection module 12. In the lower figure, at 10:19 AM, $G_{2\_23}$ appeared two consecutive trending divergences equal to 1 (as shown in a circle), and thus the degradation sign in the two adjacent fuel cell groups $G_2$ and $G_3$ was also detected from the second detection module 13. Thus, the detection fusion module 14 reported a degradation at 10:19 AM based on the decision making rule shown in equation (5).

However, the operator did not find abnormality in the fuel cell stack until at 10:40 AM during the test. It can be seen from FIG. 7 that the detection time of using the degradation detecting method of the present disclosure is 21 minutes ahead of the existing operator inspection. Furthermore, the operator inspection is based entirely on the operator's personal experience and may be based on a voltage trend or a temperature trend. Thus, the detection time of the operator inspection may vary for different operators. Using the degradation detecting method of the present disclosure provides faster and more consistent degradation detection, earns more time for operators to take remedy actions, and eliminate the needs for intensive system monitoring workload for the operators.

It should be noted that in this detection, the analysis data above was implemented based on the sampling period of one data point per one minute. If a faster detection is desired, sampling period data of one data point per one second can be used. For the faster sampling frequency data, the thresholds for detecting degradation in the upper and lower figures may need to be changed accordingly, but the structure of the degradation detecting method of the present disclosure will remain unchanged and only the thresholds for detecting degradation are needed to make adjustment.

While steps of the degradation detecting method and the managing method in accordance with embodiments of the present disclosure are illustrated as functional blocks, the order of the blocks and the separation of the steps among the various blocks shown in FIGS. 5 and 6 are not intended to be limiting. For example, the blocks may be performed in a different order and a step associated with one block may be combined with one or more other blocks or may be subdivided into a number of blocks.

While the disclosure has been illustrated and described in typical embodiments, it is not intended to be limited to the details shown, since various modifications and substitutions can be made without departing in any way from the spirit of the present disclosure. As such, further modifications and equivalents of the disclosure herein disclosed may occur to persons skilled in the art using no more than routine experimentation, and all such modifications and equivalents are believed to be within the spirit and scope of the disclosure as defined by the following claims.

What is claimed is:

1. A degradation detecting device for a fuel cell stack, wherein the fuel cell stack comprises fuel cell groups which are connected in series, the degradation detecting device comprising:
   one or more sensors for measuring signals of two adjacent fuel cell groups to obtain a measurement of each of the two adjacent fuel cell groups;
   a first detection module for detecting a rate of change of deviation between the measurements of the two adjacent fuel cell groups and generating a first detection result of the fuel cell stack based on the detected rate of change of deviation;
   a second detection module for detecting a trending divergence between the measurements of the two adjacent fuel cell groups and generating a second detection result of the fuel cell stack based on the detected trending divergence; and
   a detection fusion module for fusing the first detection result and the second detection result to generate a final detection result of the fuel cell stack.

2. The degradation detection device of claim 1, wherein the one or more sensors comprise one or more voltage sensors for measuring voltages of the two adjacent fuel cell groups, or one or more temperature sensors for measuring temperatures of the two adjacent fuel cell groups.

3. The degradation detection device of claim 1, wherein when the rate of change of deviation between the measurements of the two adjacent fuel cell groups is above a predetermined threshold, the first detection result generated by the first detection module indicates a degradation sign of the fuel cell stack.

4. The degradation detection device of claim 1, wherein when the rates of change of the two measurements have different sign, the second detection result generated by the second detection module indicates a degradation sign of the fuel cell stack.

5. The degradation detection device of claim 1, wherein the detection fusion module fuses the first detection result and the second detection result by weighting the first detection result and the second detection result.

6. The degradation detection device of claim 5, wherein the detection fusion module weights the first detection result and the second detection result based on respective confidences of the first detection module and the second detection module which are indicative of respective detection reliability of the first detection module and the second detection module.

7. The degradation detection device of claim 6, further comprising:
   a first confidence generation module for generating the confidence of the first detection module based on historical performance of the first detection result; and
   a second confidence generation module for generating the confidence of the second detection module based on historical performance of the second detection result.

8. The degradation detection device of claim 7, wherein the first confidence generation module and the second confidence generation module are respectively integrated in the first detection module and the second detection module.

9. A fuel cell system, comprising:
   one or more fuel cell stacks which are connected in parallel, each fuel cell stack comprising serially connected fuel cell groups;
   a degradation detection device for detecting degradation of the one or more fuel cell stacks, comprising:
      one or more sensors for measuring signals of two adjacent fuel cell groups in one fuel cell stack to obtain a measurement of each of the two adjacent fuel cell groups;
      a first detection module for detecting a rate of change of deviation between the measurements of the two adjacent fuel cell groups and generating a first detection result of the one fuel cell stack based on the detected rate of change of deviation;
      a second detection module for detecting a trending divergence between the measurements of the two adjacent fuel cell groups and generating a second detection result of the one fuel cell stack based on the detected trending divergence; and
      a detection fusion module for fusing the first detection result and the second detection result to generate a final detection result of the one fuel cell stack; and
   a controller for controlling the one degraded fuel cell stack when the one fuel cell stack is detected to degradation.

10. The fuel cell system of claim 9, comprising:
    a data collection unit comprising the one or more sensors and configured for collecting fuel cell data in the fuel cell system; and
    a state determination unit for determining whether the fuel cell system is in an operating state based on the collected fuel cell data, wherein when the fuel cell system is in the operating state, the degradation detecting device is enabled.

11. The fuel cell system of claim 10, further comprising:
    a data processing unit for processing the collected fuel cell data, wherein the state determination unit determines whether the fuel cell system is in the operating state based on the processed fuel cell data.

12. The fuel cell system of claim 10, wherein the fuel cell data comprises at least one of temperature, power, voltage, current, flowrates, gas composition and pressures.

13. The fuel cell system of claim 9, wherein the one or more sensors comprise one or more voltage sensors for measuring voltages of the two adjacent fuel cell groups, or one or more temperature sensors for measuring temperatures from the two adjacent fuel cell groups.

14. The fuel cell system of claim 9, wherein the detection fusion module weights the first detection result and the second detection result based on respective confidences of the first detection module and the second detection module which are indicative of respective detection reliability of the first detection module and the second detection module.

15. A method for managing a fuel cell system, comprising:
    detecting degradation of parallelly connected fuel cell stacks in the fuel cell system, comprising:
       measuring signals of two adjacent of serially connected fuel cell groups in one fuel cell stack to obtain a measurement of each of the two adjacent fuel cell groups;
       detecting a rate of change of deviation between the measurements of the two adjacent fuel cell groups and generating a first detection result of the one fuel cell stack based on the detected rate of change of deviation;

detecting a trending divergence between the measurements of the two adjacent fuel cell groups and generating a second detection result of the one fuel cell stack based on the detected trending divergence; and fusing the first detection result and the second detection result to generate a final detection result of the one fuel cell stack; and controlling the one degraded fuel cell stack when the one fuel cell stack is detected to degradation.

16. The method of claim 15, wherein controlling the one degraded fuel cell stack comprises:

switching the one degraded fuel cell stack to a hot standby state;

monitoring all the temperatures for the one degraded fuel cell stack; and processing the one degraded fuel cell stack based on all the monitored temperatures for the one degraded fuel cell stack.

17. The method of claim 16, wherein processing the one degraded fuel cell stack comprises:

determining whether any temperature for the one degraded fuel cell stack exceeds a predetermined temperature range; and isolating the one degraded fuel cell stack when there is any temperature for the one degraded fuel cell stack exceeding the predetermined temperature range.

18. The method of claim 17, wherein processing the one degraded fuel cell stack further comprises:

switching the one degraded fuel cell stack to a normal operating state when no temperature for the one degraded fuel cell stack exceeds the predetermined temperature range in a predetermined time.

19. The method of claim 17, further comprising:

when the number of isolated fuel cell stacks exceeds a predefined number, shutting down the fuel cell system.

20. The method of claim 16, wherein the temperatures for the one degraded fuel cell stack comprise the temperatures of the fuel cell groups, a temperature of a top plate, and one or more temperatures of a bottom plate of the one degraded fuel cell stack.

* * * * *